: US007224953B2

United States Patent
Hosoi

(10) Patent No.: US 7,224,953 B2
(45) Date of Patent: May 29, 2007

(54) RECEIVING DEVICE AND TELEVISION RECEIVER

(75) Inventor: Masayuki Hosoi, Saitama (JP)

(73) Assignee: Sony Corporation, Tokyo (JP)

( * ) Notice: Subject to any disclaimer, the term of this patent is extended or adjusted under 35 U.S.C. 154(b) by 172 days.

(21) Appl. No.: 10/522,275

(22) PCT Filed: Jul. 25, 2003

(86) PCT No.: PCT/JP03/09472

§ 371 (c)(1),
(2), (4) Date: Jan. 24, 2005

(87) PCT Pub. No.: WO2004/012446

PCT Pub. Date: Feb. 5, 2004

(65) Prior Publication Data

US 2006/0050186 A1    Mar. 9, 2006

(30) Foreign Application Priority Data

Jul. 25, 2002    (JP)    ............................. 2002-216687

(51) Int. Cl.
*H04B 1/10*    (2006.01)
(52) U.S. Cl. .................. 455/301; 455/300; 455/575.1; 455/106
(58) Field of Classification Search ............. 455/575.1, 455/106, 300, 301
See application file for complete search history.

(56) References Cited

U.S. PATENT DOCUMENTS 4,956,526 A * 9/1990 Murakami et al. ....... 178/18.08

(Continued)

FOREIGN PATENT DOCUMENTS

JP    11-163755    6/1999

(Continued)

OTHER PUBLICATIONS

Microfilm of the specification and drawings annexed to the request of Japanese Utility Model Application No. 107173/1988 (Laid-open No. 28124/1990) (Sanyo Electric Co., Ltd.), Feb. 23, 1990.

*Primary Examiner*—Nay Maung
*Assistant Examiner*—Richard Chan
(74) *Attorney, Agent, or Firm*—Frommer Lawrence & Haug LLP; William S. Frommer; Thomas F. Preson

(57) ABSTRACT

A receiving device in which the shielding performance is improved to solve a pulling problem in a receiving device of a direct conversion system is provided.

The receiving device includes: a substrate on which an amplifier 30 that amplifies high frequency input signals, a filter 34 that passes only intended signals and removes unintended signals by tuning the amplified high frequency input signals and a direct conversion unit 36 that converts and detects directly the high frequency input signal from the filter; a first high-frequency shielding portion 90 fixed to a substrate 20 and which stands at the boundary between the filter and the other units for preventing radiation of the high frequency electro-magnetic wave that is induced from the filter to the space; and a second high-frequency shielding portion 60 provided facing and close to the filter surrounded by the first high-frequency shielding portion 90 and which prevents radiation of high frequency electro-magnetic waves induced from the filter to the space, together with the first high-frequency shielding portion 90.

4 Claims, 11 Drawing Sheets

U.S. PATENT DOCUMENTS

| | | | | |
|---|---|---|---|---|
| 5,678,216 | A * | 10/1997 | Matai | 455/269 |
| 6,072,992 | A * | 6/2000 | Mishima et al. | 455/76 |
| 6,118,672 | A * | 9/2000 | Yamauchi et al. | 361/818 |
| 6,249,256 | B1 * | 6/2001 | Luxon et al. | 343/702 |
| 6,281,946 | B1 * | 8/2001 | Hisada et al. | 348/725 |
| 6,434,372 | B1 * | 8/2002 | Neagley et al. | 455/106 |
| 2003/0002411 | A1 * | 1/2003 | Kuroda | 369/47.54 |
| 2005/0136850 | A1 * | 6/2005 | Arai | 455/88 |

FOREIGN PATENT DOCUMENTS

| | | |
|---|---|---|
| JP | 2000-294950 | 10/2000 |
| JP | 2001-345765 | 12/2001 |

* cited by examiner

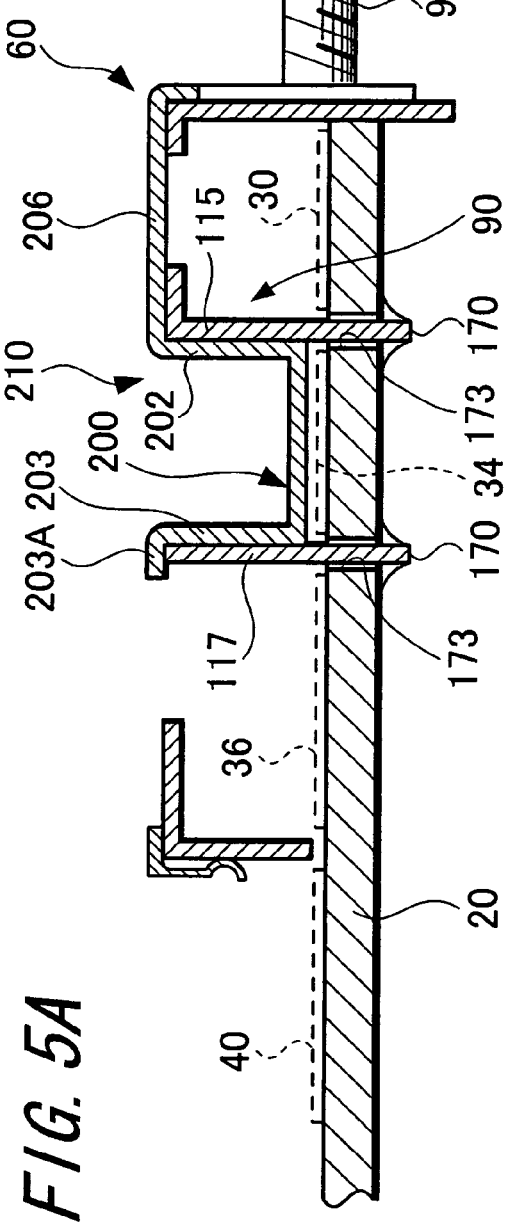
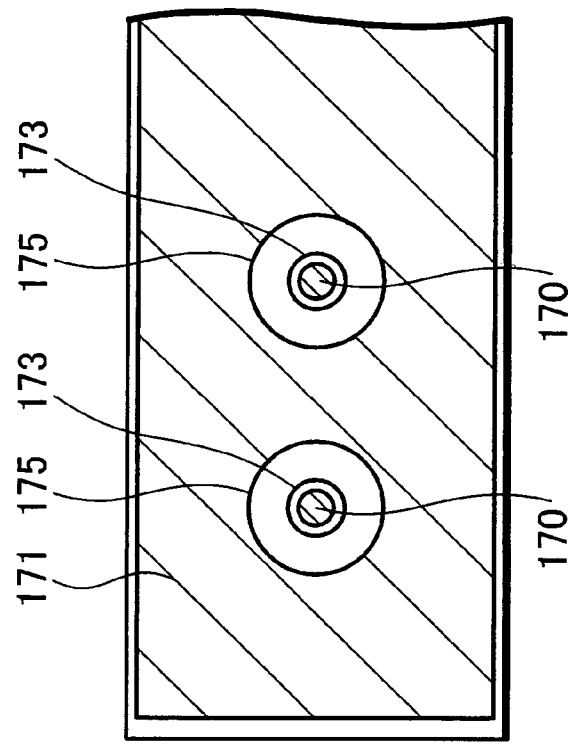
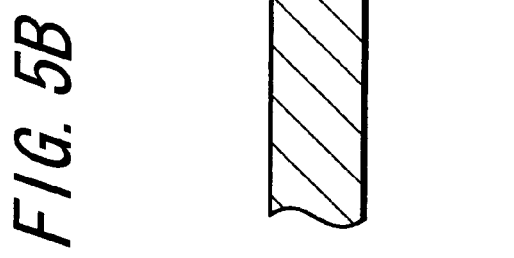
FIG. 5A
FIG. 5B
FIG. 5C

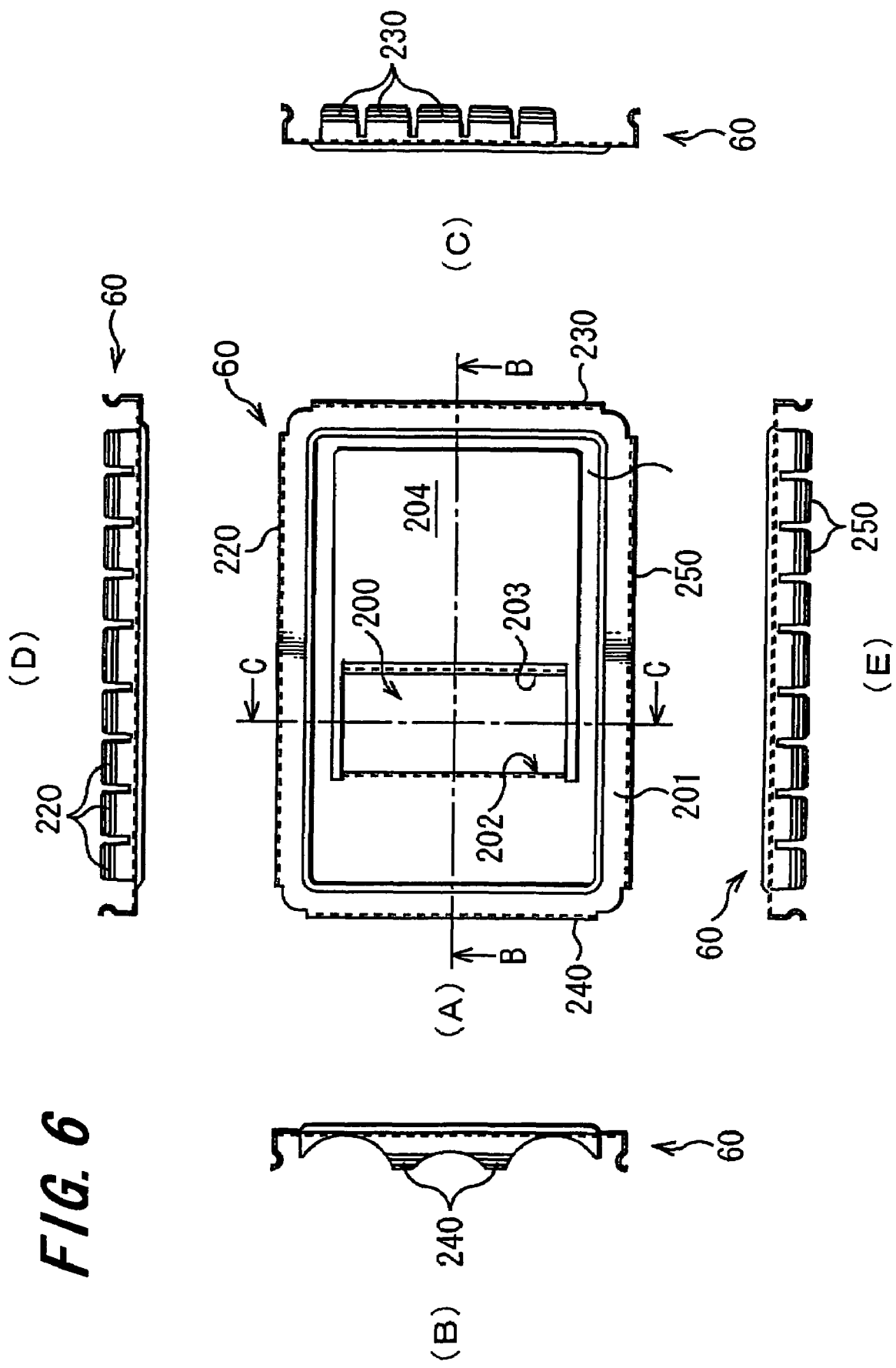

C-C

B-B

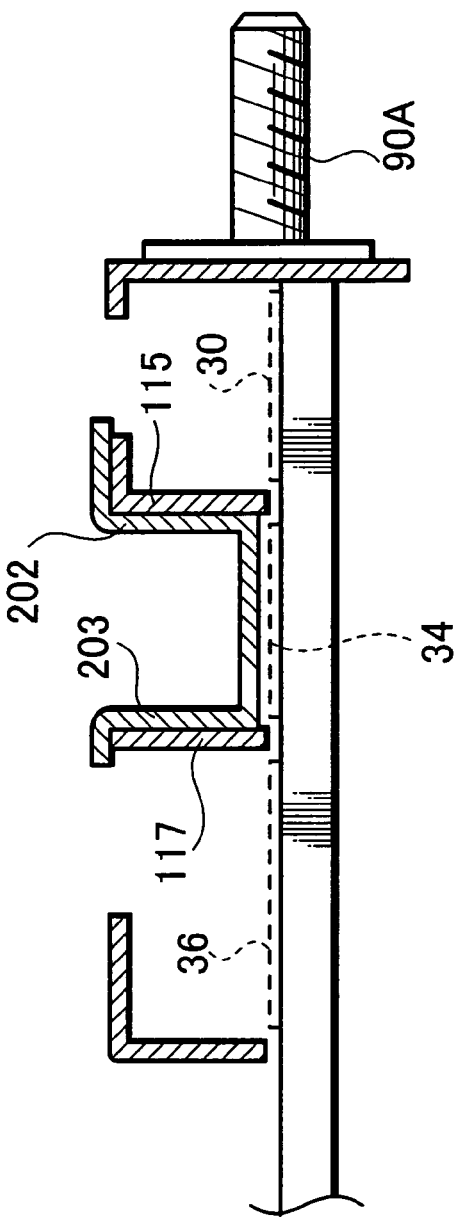
FIG. 10
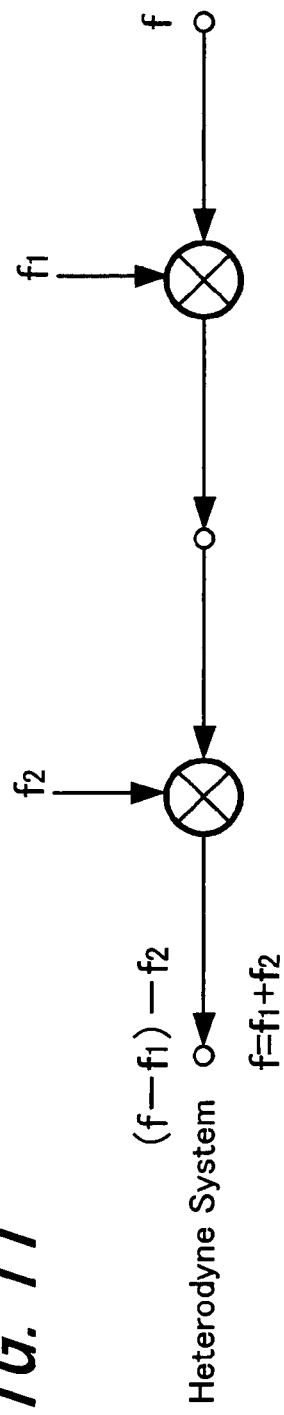
FIG. 11 Heterodyne System
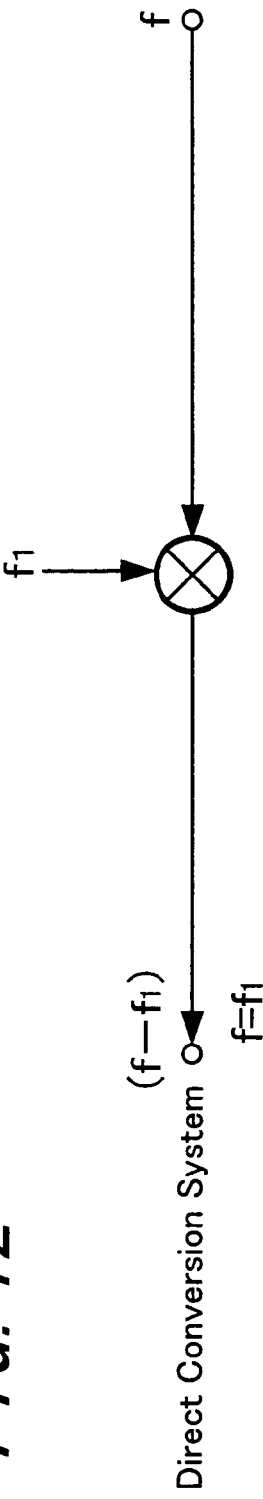
FIG. 12 Direct Conversion System

RECEIVING DEVICE AND TELEVISION RECEIVER

TECHNICAL FIELD

The present invention relates to a receiving device for receiving a high frequency input signal through a receiving antenna and the television receiver including the receiving device.

BACKGROUND ART

As an example of electronic equipment having a receiving device that receives a high frequency input signal, a television receiver can be mentioned. The television receiver includes a receiving device that receives a high frequency input signal through an antenna.

In a conventional receiving device, a so-called heterodyne system is employed as shown in FIG. 11.

In the heterodyne system as shown in FIG. 11, a high frequency input signal f is input to an antenna 1000. The high frequency input signal f is mixed with a mixing frequency f1 to be selected, so that the intermediate frequency (f−f1) is obtained. Further, after passing through a filter or the like, the intermediate frequency (f−f1) is mixed with a constant frequency f2, and a base band signal ((f−f1)−f2) is obtained. This base band frequency has a range of DC (direct current) to several ten MHz.

Note that in this case the relation between f, f1 and f2 is f=f1+f2.

However, the heterodyne system mentioned above requires a large number of components and frequency conversion of many times, which results in a high cost.

Then, as shown in FIG. 12, a direct conversion system having a small number of components and a simple structure is beginning to be used. In the direct conversion system, when a high frequency input signal f is input to an antenna 1010, the mixing frequency f1 which is the same as the selection frequency is mixed with the high frequency input signal, and the differential signal is taken out to obtain (f−f1) as a base band signal.

Note that, in this case, the relationship between f and f1 is f=f1.

In such a receiving device, as shown in FIG. 13, an amplifier 1020, a filter 1024, a direct conversion unit 1026 and a digital demodulator 1028 are formed on a substrate 1016. A shield case 1030 and a shield cover 1040 are detachably loaded onto the substrate 1016, and the shield case 1030 and shield cover 1040 shield each elements on the substrate 1016 from high frequency waves.

The shield cover 1040 is engaged with ribs 1061 in the shield case 1030, using a plurality of claws 1060 on the peripheral portion thereof to be hooked, and the shield cover 1040 and shield case 1030 are contacted and fixed to each other.

The shield case 1030 has a frame 1055, and an inner partition plate 1056 is disposed in the center of the frame 1055. The frame 1055 has a plurality of claws 1050, and when the claws 1050 are fixed into concave portions 1017 in the substrate 1016, the shield case 1030 is fixed to the substrate 1016.

With the above structure, the amplifier 1020, the filter 1024, the direct conversion unit 1026 and the digital demodulator 1028, each of which is a functional block of the substrate 1016, are surrounded and shielded.

The inner partition plate 1056 of the shield case 1030 is, for example, disposed to shield between the filter 1024 and the direct conversion unit 1026, where the partition plate 1056 is soldered to the ground of the substrate 1016 to function as a shield plate.

DISCLOSURE OF THE INVENTION

However, with the structure of the conventional shield cover 1040 and shield case 1030, a gap is generated between the partition plate 1056 and the shield cover 1040, and thus, the higher the frequency of high frequency input signal becomes, the more the electromagnetic wave of high frequency leaks from the gap between the partition plate 1056 and the shield cover 1040 to reduce the effectiveness of shielding.

Also, when it is seen from the viewpoint of high frequency, with respect to the inner partition plate 1056 the ground impedance is lowest at the portion soldered with the ground of the substrate 1016; however, the ground impedance of a portion of the shield case which is far from the inner partition plate 1056 becomes high.

With respect to the shield cover 1040, a plurality of claws 1060 and a spring-shaped weight 1070 in the shield cover 1040 are only in contact with the shield case 1030 side, and the other portions of the shield cover and shield case are not contacted; thus, no other portion than the plurality of claws 1060 and the spring-shaped weight 1070 is provided where the ground impedance becomes low.

High frequency electric current is easily induced at the portion where the ground impedance is high, and with the induced current the high frequency energy may again radiate into the space, so that efficient shielding can not sufficiently be obtained when a conventional shield cover and shield case are used.

In a receiving device having a direct conversion system, the high frequency input signal f which is the receiving signal, is the same as the local frequency f1 as mentioned above, and in the case that the high-frequency input signal with a strong signal level is inputted into a input unit of a receiving device, the high frequency energy becomes highly strong at the initial stage amplifier 1020 and also at the filter 1024 of a sub-tuning band-pass filter and others. Particularly, high frequency energy is easily radiated from the filter 1024 due to the Q value of a circuit in the substrate 1016. The problem (of so-called pulling) that this radiated energy affects the local frequency of selection unit occurs in a receiving device employing the direct conversion system.

In light of the above, the present invention aims to provide a receiving device and a television receiver, in which the above problem is solved and the shielding performance is improved to solve the pulling problem in the receiving device employing the direct conversion system.

The present invention is a receiving device including: a substrate provided with an amplifier that amplifies a high frequency input signal, a filter that passes only an intended signal and a detector that detects an output signal from the filter, having a land of the reference potential in the vicinity of a hole bored at the boundary between the filter of the substrate and the surrounding area thereof; a shield case having a shield plate portion made of a metal plate and a projection that is inserted into the hole of the substrate and is connected to a land of the reference potential by soldering, in which the filter is surrounded by the shield plate portion; and a metal shield cover that covers the shield plate portion of the shield case.

Accordingly, in the state in which the projection of the shield case is soldered with the land of the reference potential of the substrate, a shield case made to stand on the boundary between the filter and the other units can surround the filter. In addition, a shield cover is disposed to cover the shield case and prevents the leakage of radiation of high frequency electro-magnetic waves generated from the filter into the space, so that the pulling problem in a receiving device having the direct conversion system can be solved.

In the above mentioned receiving device according to the present invention, the above shield cover has: a main surface, a part of which is deeply bent to form a dropped-lid shape and which covers the filter, and a first surface-contact portion and a second surface-contact portion formed to oppose to each other on both end portions of the main surface, which stand up from the main surface portion with a predetermined height and are disposed to come in surface contact with the shield plate portion of the shield case; in which the first surface-contact portion is provided at the boundary between the main surface portion and a portion that is not deeply bent of the shield cover.

Accordingly, since the shield cover is in surface contact with the shield plate portion of the shield case with the first and second surface-contact portions, the effectiveness of shielding of the substrate can further be improved.

In the above mentioned receiving device according to the present invention, the second surface-contact portion of the shield cover is formed to have an angle larger than a right angle with respect to the main surface portion.

Accordingly, when covering the shield case, the shield cover can be prevented from pulling off.

The present invention is a television receiver having the above mentioned receiving device, further including: a digital demodulator that demodulates a transport stream from an output of a detector, a data separator that separates compressed data of the desired program from data multiplexed in the transport stream from the digital demodulator, an MPEG demodulator that expands a compressed data of the program from the data separator, an image processor that converts the expanded data from the MPEG demodulator into a video output signal, and a display that displays the video output signal from the image processor.

In the television receiver according to the present invention, the substrate has an amplifier that amplifies a high frequency input signal, a filter that passes only an intended signal and removes an unintended signal by tuning the amplified high frequency input, and a detector that performs direct conversion on the high frequency input signal from a filter to be detected.

In the state in which a projection of a shield case is soldered with a land of the reference potential, the shield case stands at the boundary between a filter and the other unit to surround the filter. A shield cover is disposed to cover the filter surrounded by the shield case. The shield cover prevents the leakage of radiation of high frequency electro-magnetic waves from the filter into the space.

Accordingly, the pulling problem in a receiving device having the direct conversion system can be solved.

BRIEF DESCRIPTION OF DRAWINGS

FIGS. 5A to 5C are sectional views showing an example of the construction of a shield cover, a shield case, and a substrate;

FIG. 6 is a view showing the construction of a shield cover;

FIG. 10 is a view showing an example of the cross section of a shield cover, a shield case and a substrate of a receiving device of FIG. 9;

FIG. 11 is a drawing showing a conventional heterodyne system;

FIG. 12 is a drawing showing a direct conversion system; and

BEST MODE FOR CARRYING OUT THE INVENTION

Hereinafter, embodiments of the present invention will be explained in detail with reference to the accompanying drawings.

It should be noted that embodiments mentioned hereinafter are the preferred examples and thus the technically preferred various limitations are given thereto; however, the scope of the present invention is not limited to those embodiments as long as there is no mention of limiting the present invention in the following explanation.

Figure 1:
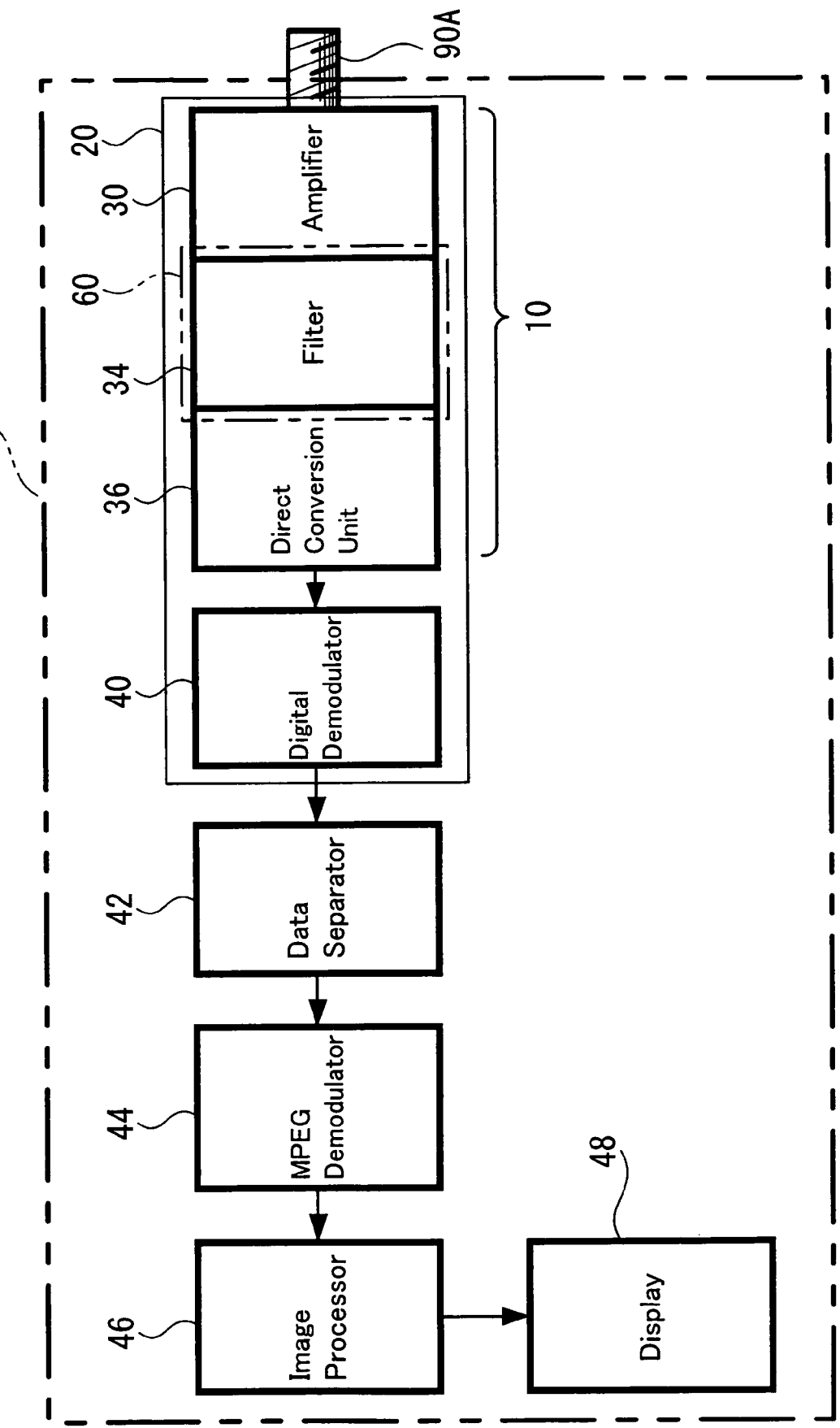
FIG. 1 is a block diagram showing an example of electronic equipment including a receiving device according to the present invention.

FIG. 1 shows a television receiver as an example of electronic equipment having a receiving device according to the present invention.

A television receiver 14 includes a receiving device 10, a data separator 42, an MPEG demodulator 44, an image processor 46 and a display 48. The receiving device 10 has a substrate 20 (also call a circuit board), and the substrate 20 has an amplifier 30, a filter 34, a direct conversion unit 36 and a digital demodulator 40.

The amplifier 30, the filter 34, the direct conversion unit 36 and the digital demodulator 40 are the functional blocks formed on the substrate 20. The amplifier 30 is connected to a receiving antenna through a connector 90A, and the receiving antenna receives a high frequency input signal f. The high frequency input signal f is amplified in the amplifier 30. The filter 34 makes the amplified high frequency input signal tuned to pass only an intended signal and also to remove an unintended signal, and the filter 34 generates a tuning frequency (a local frequency) f1.

The direct conversion unit 36 generates a base band (f–f1) by subtracting a local frequency f1 generated in the filter 34 from the high frequency input signal f. Specifically, the direct conversion unit 36 has a function of tuning the amplified high frequency input signal f to a local frequency f1 generated in the filter 34 to convert directly and detect.

The digital demodulator 40 has a function of demodulating a transport stream from a modulated digital signal.

A data separator 42 performs in a unit of packets filtering of video information, audio information, program specifying information, program arrangement information, data broadcast information, and others which are multiplexed with a digitally demodulated transport stream, to separate and select compressed data of the desired program.

The MPEG demodulator 44 expands compressed data of the program separated by the data separator 42. The image processor 46 outputs a video output signal from the expanded data by the MPEG demodulator 44, and displays an image on the display 48 of a plasma display or the like, for example. Also, audio information is processed in an audio processor not shown in the drawing to be output from a speaker or the like.

Figure 2:
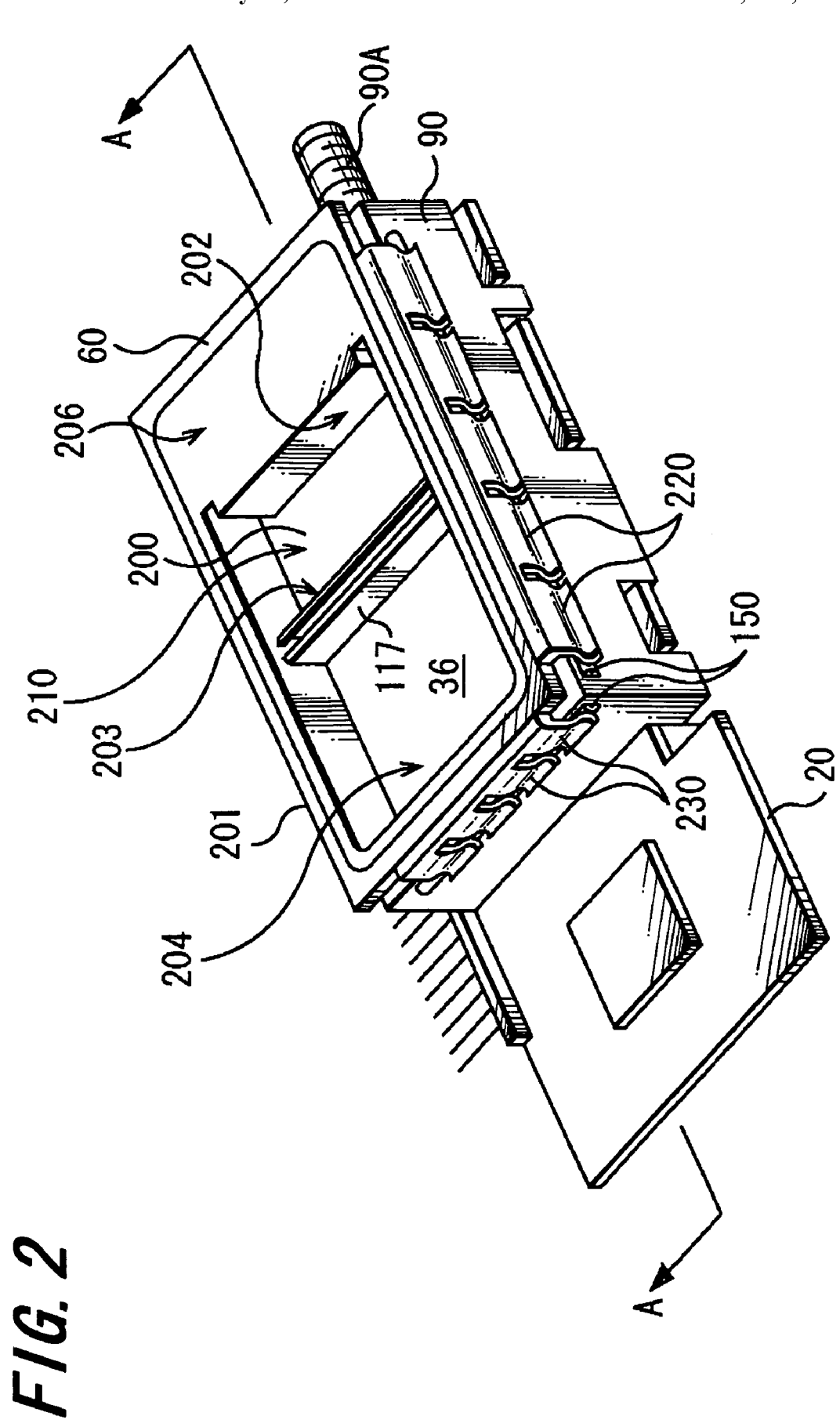
FIG. 2 is a perspective view showing an example of the construction of the receiving device of FIG. 1.

FIG. 2 shows an embodiment of the receiving device 10 of FIG. 1.

The receiving device 10 has a substrate 20, a shield cover 60 and a shield case 90.

The shield cover 60 and the shield case 90 are made of, for example, metal such as aluminum that can prevent the leakage of a high frequency electromagnetic wave. The shield cover 60 covers the shield case 90 and is detachably attached thereto. The shield case 90 is attached detachably to the substrate 20.

Figure 3:
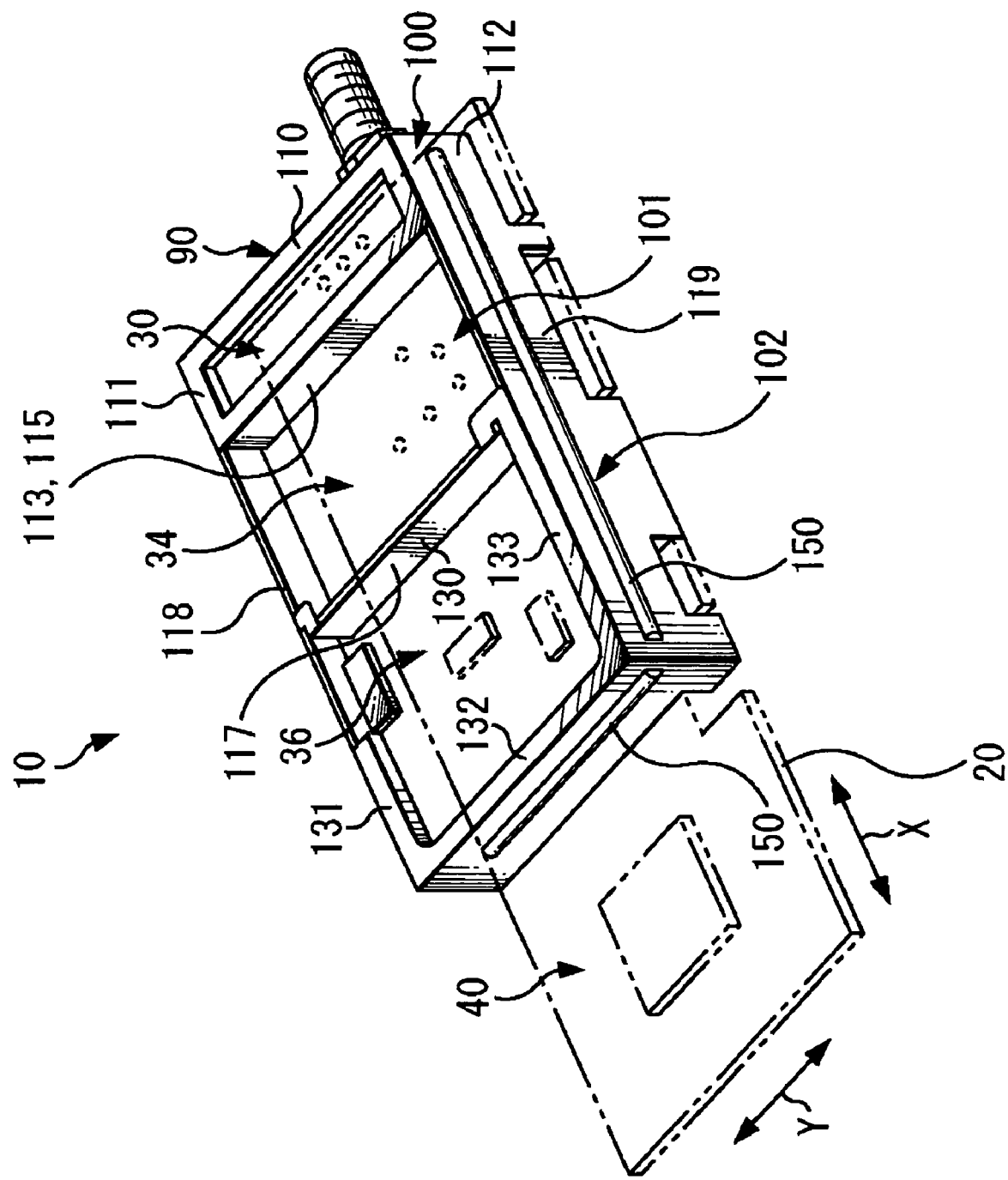
FIG. 3 is a view showing the state in which a shield cover is removed from the receiving device of FIG. 2.
Figure 4:
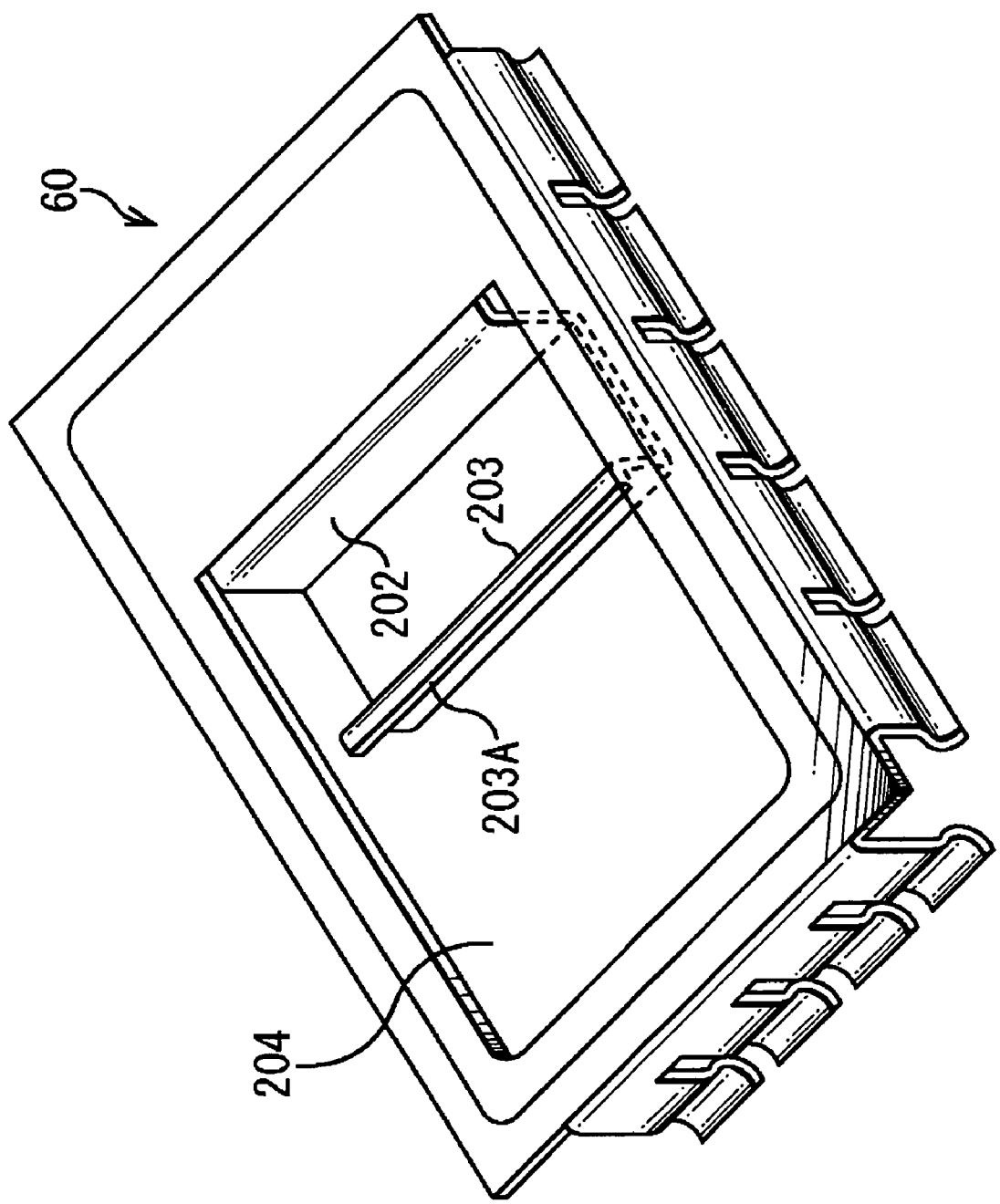
FIG. 4 is a perspective view showing only the shield cover.

FIG. 3 shows the state in which only the shield case 90 is installed on the substrate 20, and the shield cover 60 is removed from the shield case 90. FIG. 4 shows the structure of the shield cover 60.

FIG. 5A shows an example of the shape of cross section on A—A line of FIG. 2. As shown in FIG. 5A, the amplifier 30, the filter 34, the direct conversion unit 36 and the digital demodulator 40 are formed sequentially on the one side surface of the substrate 20.

FIG. 5B shows the state in which projections 170 of the shield case 90 are inserted into holes 173 of the substrate 20, and soldered.

Also, FIG. 5C shows the other side surface of the substrate 20, in which the projections 170 of the shield case 90 are inserted into the holes 173 of the substrate 20, though not yet soldered.

As shown in FIG. 5C, a ground pattern 171 is formed on almost whole the surface on the other side surface of a substrate 20; rounds 175 are provided around the holes 173 of the substrate 20; the rounds 175 and projections 170 of the shield case 90 are soldered to fix the shield case 90 and the shield case 90 is electrically connected to the ground pattern 171; and thus, the shield case 90 can be grounded.

By covering the shield case 90 with the shield cover 60, the leakage of radiation of high frequency generated from the filter into the space is efficiently prevented.

First, the structure of the shield case 90 will be explained with reference to FIGS. 2 and 3.

The shield case 90 is formed by bending and punching out, for example, an aluminum plate, which corresponds to the first high-frequency shielding portion. On the other hand, the shield cover 60 corresponds to the second high-frequency shielding portion.

In order to prevent the radiation of high frequency electro magnetic waves into the space from each of the amplifier 30, filter 34 and direct conversion unit 36 which are functional blocks on the substrate 20 as shown in FIG. 5, the shield case 90 functioning as the first high-frequency shielding portion is formed to surround the above mentioned amplifier 30, filter 34 and direct conversion unit 36.

As shown in FIG. 3, the shield case 90 has a first frame 100 that surrounds the amplifier 30, a second frame 101 that surrounds the filter 30 and a third frame 102 that surrounds the direct conversion unit 36. The first frame 100, the second frame 101 and the third frame 102 are continuously formed.

The first frame 100 is formed to stand at the boundary between the amplifier 30 and the other units and to surround the amplifier 30, having side surface portions 110, 111, 112 and 113. Similarly, the second frame 101 is formed to stand at the boundary between the filter 34 and the other units and to surround the filter 34, having a first shield plate portion 115, a second shield plate portion 117, a third shield plate portion 118 and a fourth shield plate portion 119.

The side surface portion 110 and the side surface portion 113 of the first frame 100 oppose to each other as shown in FIG. 3, and also the side surface portion 111 and the side surface portion 112 oppose to each other. Those four side surface portions 110 to 113 are formed to stand to separate the amplifier 30 and the filter 34 that is the other unit.

The first shield plate portion 115 and the second shield plate portion 117 of the second frame 101 oppose to each other, and also the third shield plate portion 118 and the fourth shield plate portion 119 oppose to each other. The first shield plate portion 115 is formed to stand at the first boundary between the amplifier 30 and the filter 34. The second shield plate portion 117 is formed to stand at the second boundary between the filter 34 and the direct conversion unit 36.

The third shield plate portion 118 and the fourth shield plate portion 119 are formed to stand between the filter 34 and the outside. Accordingly, the second frame 101 is formed to stand at the boundaries of four corners of a rectangular-shaped filter 34 so that high frequency electromagnetic waves can be shielded. Note that the side surface portion 113 and the first shield plate portion 115 are formed of the portion used in common.

Next, as shown in FIG. 3, the third frame 102 has side surface portions 130, 131, 132 and 133 to surround the direct conversion unit 36. The side surface portions 130 and 132 oppose to each other, and the side surface portions 131 and 133 also oppose to each other. The side surface portion 130 is disposed at the boundary between the filter 34 and the direct conversion unit 36. The side surface portion 132 is disposed to stand at the boundary between the direct conversion unit 36 and the digital demodulator 40. The side surface portion 131 and a side surface portion 133 are provided to stand at the boundary between the direct conversion unit 36 and the outside. Further the side surface portion 130 and the second shield plate portion 117 are formed of the portion used in common.

In addition, on the four side surfaces of the shield case 90 functioning as the first high-frequency shielding portion as shown in FIG. 3, ribs 150 are formed with a projection in the directions parallel to the X and Y directions of the substrate 20. FIG. 3 shows a pair of ribs 150 and 150 at the front side, and also the same ribs 150 and 150 are formed on the two surfaces of the rear side.

Further, as shown in FIG. 5A, the shield case 90 has a plurality of projections 170 on the first shield plate portion 115 and the second shield plate portion 117. As shown in FIGS. 5B and 5C, those projections 170 are inserted into the holes 173 formed on the substrate 20 and are grounded by being soldered with the lands of the ground pattern provided close to the holes 173; and the shield case 90 is attached to the substrate 20 through the projections 170.

Next, the structure of the shield cover 60 as the second high-frequency shielding portion is explained with reference to FIGS. 2, 4 and 6.

The shield cover 60 is formed by bending metal such as aluminum or the like, for example, and is a member having an almost rectangular shape. As shown in FIG. 2, the shield cover 60 covers a shield case 90 shown in FIG. 3 and is fixed detachably.

The shield cover 60 is jointly used with the shield case 90 as the first high-frequency shielding portion to prevent the leakage of radiation in the space from the amplifier 30, the filter 34, the direct conversion unit 36 and the digital demodulator 40. Particularly, as shown in FIG. 5A, the main surface portion 200 of the shield cover 60 comes close to the surface and covers the filter 34. Accordingly, high frequency electro-magnetic waves generated in the filter 34 and radiated to the outside can be prevented completely.

Schematically explained, the shield cover 60 in FIG. 2 has a frame 201, the main surface portion 200, a first surface-contact portion 202, a second surface-contact portion 203, a hole 204 and the like.

Figure 7A:
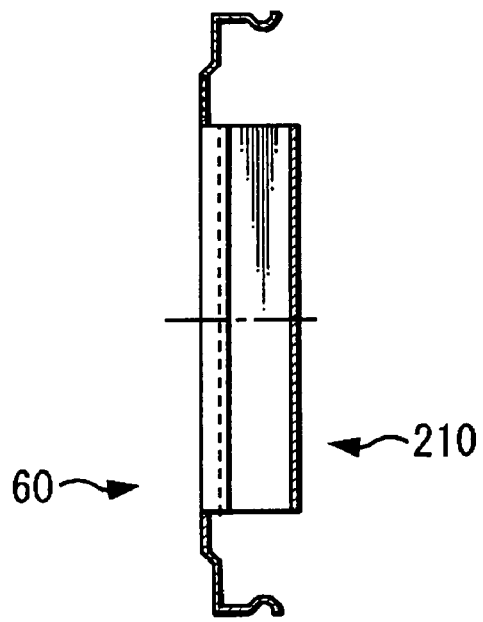
FIGS. 7A and 7B are views showing the construction of a shield cover.
Figure 7B:
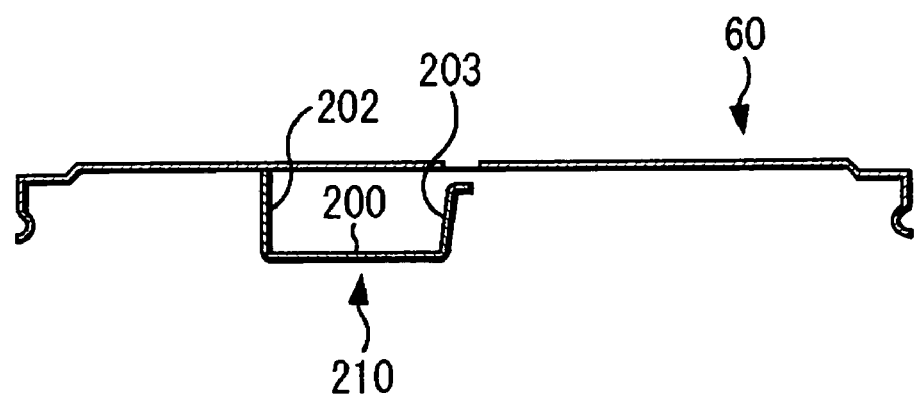

The frame 201 is formed of a rectangular shape, and as shown in FIG. 6, a plurality of claws 220, 230, 240 and 250 are formed downward on those four side surfaces. FIG. 7A shows a cross section of C—C line in FIG. 6, and FIG. 7B shows a cross section of B—B line in FIG. 6.

As shown in FIG. 6(A) and FIG. 2, the first surface-contact portion 202, the second surface-contact portion 203 and the main surface portion 200 are formed by bending a double-sided surface portion 206 of the frame 201 to have a dropped-lid shaped portion 210.

As shown in FIG. 5A, the dropped-lid shape portion 210 is provided at the position facing the filter 34. Then, the first surface-contact portion 202 is bent at right angles with respect to the surface portion 206, the main surface portion 200 is further bent at right angles with respect to the first surface-contact portion 202, and furthermore the second surface-contact portion 202 is bent at right angles with respect to the main surface portion 200. Therefore, the dropped-lid shape portion 210 has almost a U-shape when seeing the cross section thereof.

The inside surface of the first surface-contact portion 202 is in surface contact with the outside surface of the first shield plate portion 115 of the shield case 90. The inside surface of the second surface-contact portion. 203 is in surface contact with the outside surface of the second shield plate portion 117 of the shield case 90.

Further, the main surface portion 200 faces the position of the filter 34 where a small gap is provided, namely, the main surface portion comes close to the filter.

Accordingly, high frequency electromagnetic waves generated from the filter 34 can be prevented completely from radiating into the space to the outside, using the first shield plate portion 115, the second shield plate portion 117, the third shield plate portion 118 and the fourth shield plate portion 119 shown in FIG. 3 and the main surface portion 200, the first surface-contact portion 202 and the second surface-contact portion 203 shown in FIG. 5A.

As shown in FIG. 5A, the end portion of the second surface-contact portion 203 becomes an L-shaped bent portion 203A and this bent portion 203A comes in contact with the upper end surface of the second shielding portion 117. Accordingly, the main surface portion 200 can be positioned and disposed in parallel with respect to the filter 34 in the state of facing close thereto. The shield case 90 has a connector to connect to an antenna 45.

The hole 204 is formed facing the position of the direct conversion unit 36.

As shown in FIGS. 2 and 6, the shield cover 60 has the above mentioned claws 220, 230, 240 and 250, and the shield cover 60 can be fixed detachably to cover the shield case 90 with engaging those claws with the ribs 150 of the shield case 90 in FIG. 2 that is formed at the corresponding position.

As described above, a receiving device of the embodiment of the present invention uses a so-called direct conversion system, in which the filter 34 having a sub-tuning band pass filter and others may secondarily radiate larger high-frequency energy in comparison with the other units in the receiving device.

Therefore, in the embodiment shown in FIG. 2, the shield case 90 and shield cover 60 have the structure in which not only the filter 34 that radiates the highest high frequency energy secondarily, but also the amplifier 30 and the direct conversion unit 36 as shown in FIG. 5A can be shielded.

Particularly, the shield cover 60 and shield case 90 are provided with the dropped-lid shaped portion 210 as mentioned above with respect to the filter 34 which generates the highest high-frequency energy (high frequency electromagnetic waves); and the first surface-contact portion 202, the second surface-contact portion 203 and the main surface portion 200 of the dropped-lid shaped portion 210 of the shield cover 60 and the first shield plate portion 115, the second shield plate portion 117, the third shield plate portion 118 and the fourth shield plate portion 119 of the shield case 90 shown in FIG. 3 are combined to be used, so that the radiation of the high frequency energy to the outside space from the filter 34 can be prevented.

As shown in FIG. 5A, since the structure in which the first surface-contact portion 202 is in surface contact with the first shield plate portion 115 and also the second surface-contact portion 203 is in surface contact with the second shield plate portion 117 is used, a gap between the shield cover 60 and the shield case 90 occurred on the filter 34 can be prevented and the leakage of high frequency electromagnetic waves induced in the filter 34 can be prevented.

The shield cover 60 and the shield case 90 are in surface contact using the first surface-contact portion 202 and the second surface-contact portion 203 of the dropped-lid shaped portion 210, and the first shield plate portion 115 and the second shield plate portion 117 of a shield case 90. Accordingly, the strong surface-contact portion between the shield cover 60 and the second shield plate portion 117 as the partition plate can be constructed close to the position where the second shield plate portion 117 having the lowest impedance with respect to high frequency and the ground of the substrate 20 are soldered. Therefore, a ground impedance of the shield cover 60 can be greatly reduced. Consequently, the induction of high frequency current can be reduced by obtaining the decrease in ground impedance; as a result, the re-radiation of high frequency electromagnetic waves can be reduced greatly.

In the embodiment shown in FIG. 2, the shield cover 60 as the second high-frequency shielding portion has dimensions that can cover all the shield case 90.

Figure 8:
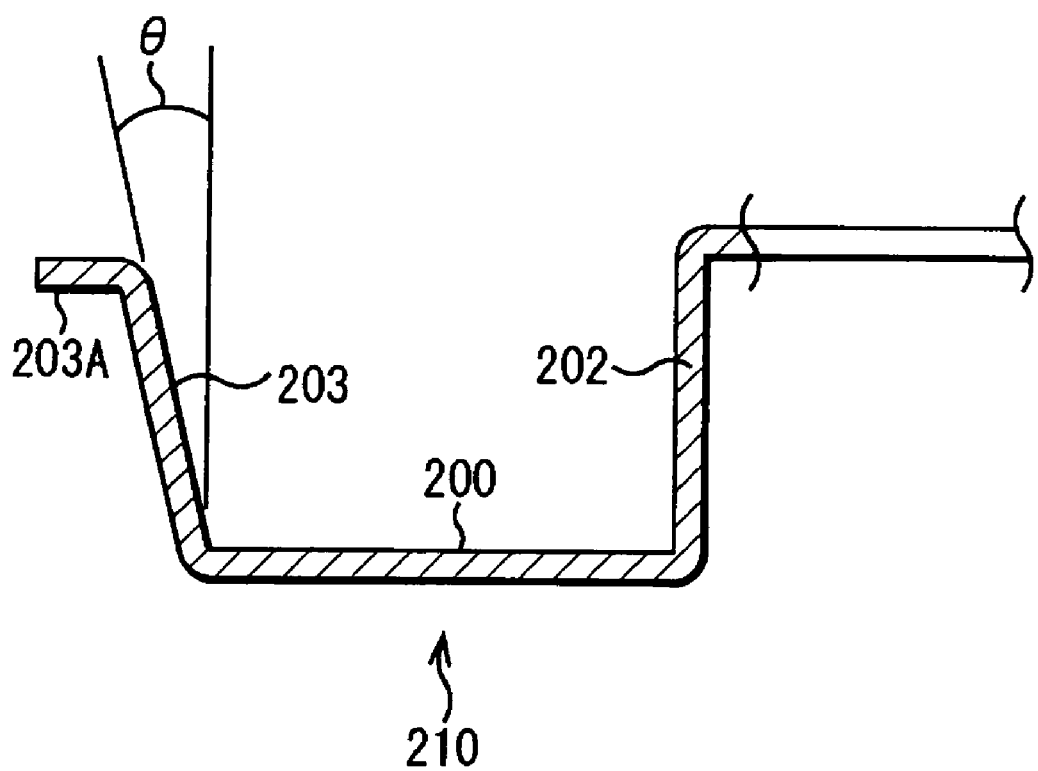
FIG. 8 is a view showing an example of the shape of the dropped-lid portion of a shield cover.

As shown in FIG. 8, the second surface-contact portion 203 of a dropped-lid shaped portion 210 is formed with tilt by θ as shown in FIG. 8 in the released state. In this state, as shown in FIG. 5A, the dropped-lid shaped portion 210 is inserted by force into the portion between the first shield plate portion 115 and the second shield plate portion 117 of the shield case 90, so that the dropped-lid shaped portion 210 may not be detached from the shield case 90 using an elasticity of the second surface-contact portion 203.

Figure 9:
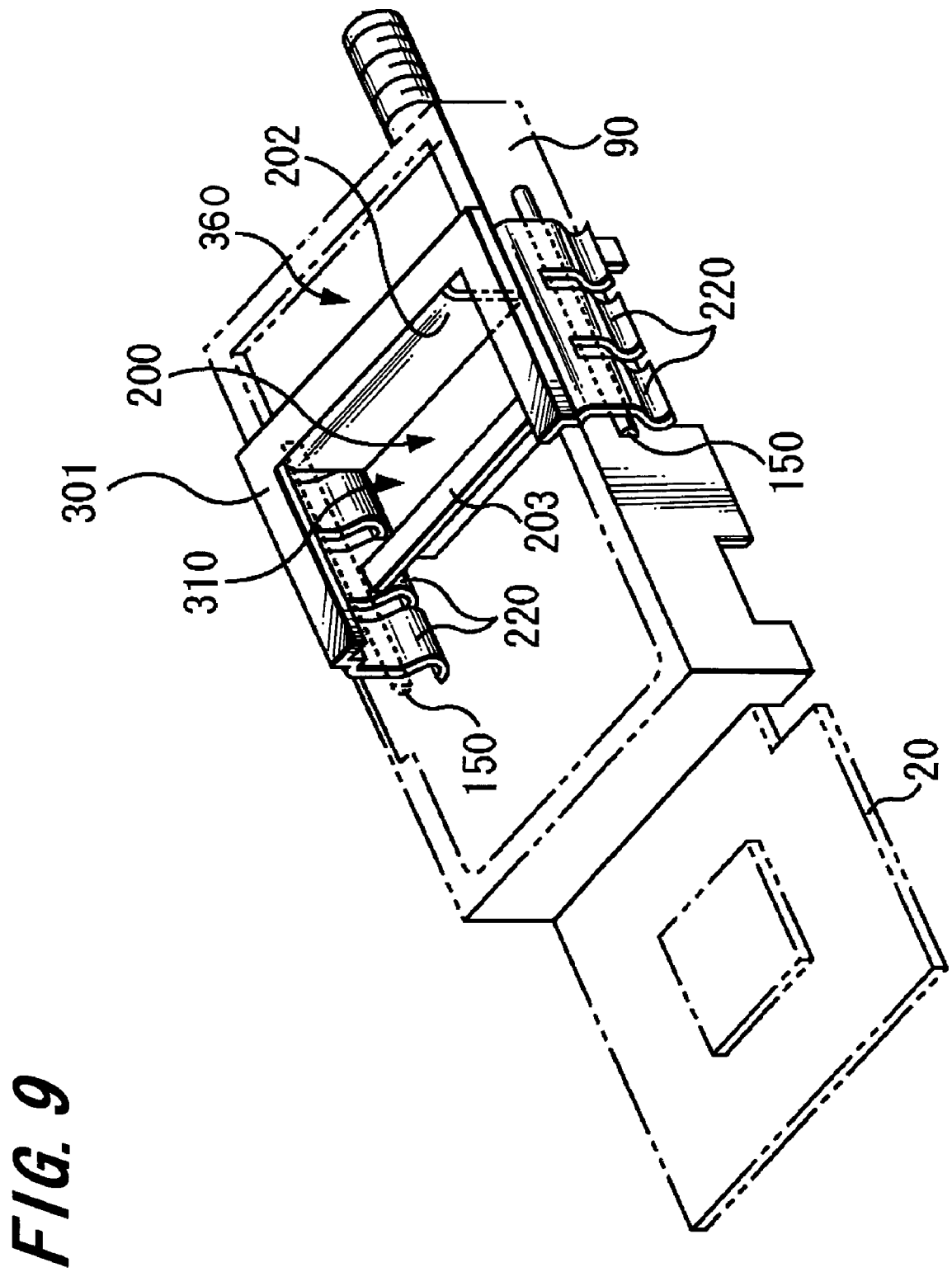
FIG. 9 is a perspective view showing another embodiment of the receiving device according to the present invention.
Figure 13:
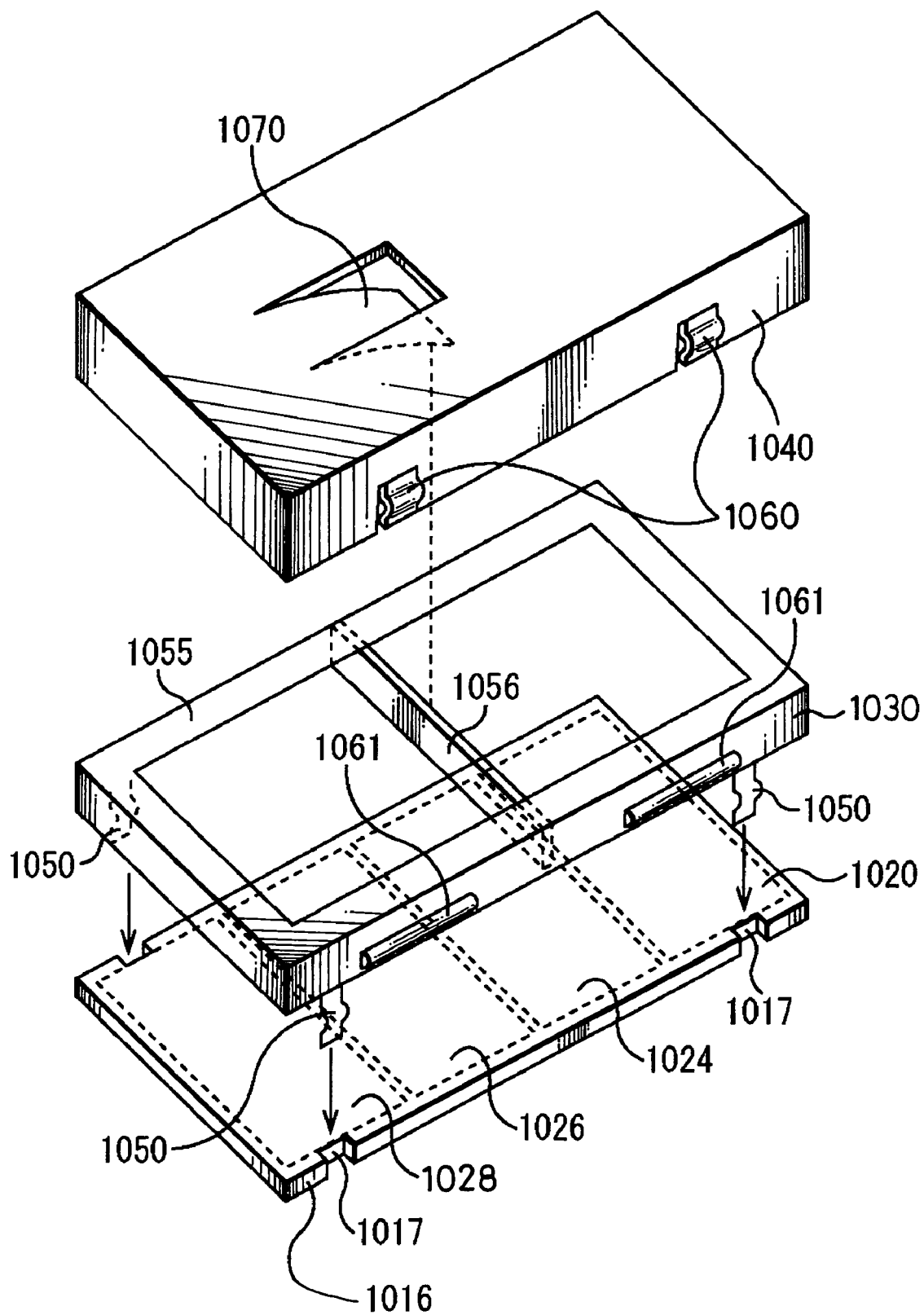
FIG. 13 is an exploded perspective view showing a conventional receiving device.

FIGS. 9 and 10 show another embodiment of the present invention.

In the embodiment shown in FIGS. 9 and 10, a shield cover 360 as the second high-frequency shielding portion is made smaller in comparison with the shield cover 60 shown in FIG. 2. The shield cover 360 is attached to the ribs 150 of the shield case 90 using the claws 220.

The shield cover 360 has the structure only facing the filter 34 as shown in FIG. 10. The shield case 90 shown in FIGS. 9 and 10 can use the same structure of the shield case 90 shown in FIG. 2. Also, the substrate 20 is the same as that shown in FIG. 2.

The shield cover 360 has a frame 301 and a dropped-lid shaped portion 310. The dropped-lid shaped portion 310 has the first surface-contact portion 202, the second surface-contact portion 203 and the main surface portion 200. Therefore, the structure of the dropped-lid shaped portion 310 is almost the same as the dropped-lid shaped portion 210 shown in FIG. 2.

As shown in FIG. 10, the first shield plate portion 115 is in surface contact with the first surface-contact portion 202. Similarly, the second shield plate portion 117 is in surface contact with the second surface-contact portion 203. The main surface portion 200 faces the filter 34 having a small space in between.

The shield cover 360 can be small-sized using such structure, and particularly the radiation from the filter 34 which secondarily induces high frequency electro-magnetic waves can be prevented.

According to the embodiments of the present invention, the shielding performance in a filter which particularly radiates high frequency electro-magnetic waves secondarily in a receiving device of a so-called direct conversion system can be improved, so that the pulling problem in a receiving device of the direct conversion system can be solved.

Even if there is electro-magnetic wave disturbance from the outside of a receiving device, penetration of the electro-magnetic waves can be reduced with the improvement in shielding performance.

Since a shield cover has a dropped-lid shaped portion, when assembling a shield cover and a shield case, the positions of a shield cover and a shield case can be easily determined mutually using the dropped-lid shaped portion, and consequently assembly can be performed easily to improve the assembling operation efficiency.

According to the embodiments of the present invention, in a receiving device of a direct conversion system, radiation of high frequency electromagnetic waves from a filter to the space can be reduced by disposing a dropped-lid shaped portion with respect to the filter in the case where an amplifier (amplifier circuit unit) and a subsequent filter (also called filter circuit unit) are covered by a shield cover.

It should be noted that the present invention is not limited to the above mentioned embodiments.

In the above mentioned embodiments, a receiving device is installed in a television receiver as an example of electronic equipment. However, a receiving device of the present invention is not limited thereto and can also be applied to the other types of electronic equipment.

The invention claimed is:

1. A receiving device comprising:
   a circuit board provided with an amplifier that amplifies a high frequency input signal, a filter that passes only an intended signal after tuning the high frequency input signal amplified by said amplifier, and a direct conversion unit in which the high frequency input signal from said filter is mixed with a local frequency signal having the same frequency to obtain a base band signal that is a differential signal, having a land of the reference potential around a hole that is used for a shield case and that is provided around said filter;
   a shield case that is formed of a metal plate and that surrounds said amplifier, filter and direct conversion unit, having a frame that surrounds said filter and a projection that is formed on said frame and that is inserted into the hole formed on said circuit board, in which said projection is connected to said land of the reference potential by soldering; and
   a metal shield cover that covers at least the frame surrounding said filter and that has a dropped-lid shape to come close to said filter;
   wherein said shield cover has a dropped-lid shaped portion that is bent to form the dropped-lid shape and a frame that is formed by bending said dropped-lid shaped portion; and
   wherein said dropped-lid shaped portion has a main surface portion that covers said filter, a first surface-contact portion formed between the main surface portion and said frame to be in surface contact with said frame, and a second surface-contact portion formed opposing to the first surface contact portion to be in surface contact with said frame.

2. A receiving device according to claim 1, wherein a digital demodulator that demodulates a transport stream from an output of said direct conversion unit is further provided on said circuit board.

3. A receiving device according to claim 1, wherein said second surface-contact portion is formed at an angle of not detaching from said shield case, when covering said shield case.

4. A television receiver comprising:
   a receiving device comprising:
      a circuit board provided with an amplifier that amplifies a high frequency input signal, a filter that passes only an intended signal after tuning the high frequency input signal amplified by said amplifier, and a direct conversion unit in which the high frequency input signal from said filter is mixed with a local frequency signal having the same frequency to obtain a base band signal that is a differential signal, having a land of the reference potential around a hole that is used for a shield case and that is provided around said filter;
      a shield case that is formed of a metal plate and that surrounds said amplifier, filter and direct conversion unit, having a frame that surrounds said filter and a projection that is formed on said frame and that is inserted into the hole formed on said circuit board, in which said projection is connected to said land of the reference potential by soldering; and
      a metal shield cover that covers at least the frame surrounding said filter and that has a dropped-lid shape to come close to said filter;
      wherein said shield cover has a dropped-lid shaped portion that is bent to form the dropped-lid shape and a frame that is formed by bending said dropped-lid shaped portion; and
      wherein said dropped-lid shaped portion has a main surface portion that covers said filter, a first surface-contact portion formed between the main surface portion and said frame to be in surface contact with said frame, and a second surface-contact portion formed opposing to the first surface contact portion to be in surface contact with said frame;
   a digital demodulator that demodulates a transport stream from an output of a detector;
   a data separator that separates compressed data of the desired program from data multiplexed in the transport stream from said digital demodulator;
   an MPEG demodulator that expands the compressed data of the desired program from said data separator;
   an image processor that converts the expanded data from said MPEG demodulator to a video output signal; and
   a display that displays a video output signal from said image processor.

* * * * *